(12) United States Patent
Maher

(10) Patent No.: US 8,061,016 B2
(45) Date of Patent: Nov. 22, 2011

(54) SUPERCONDUCTING COIL FABRICATION

(75) Inventor: Eamonn Maher, Oxon (GB)

(73) Assignee: 3-CS Ltd, Malvern, Worcestershire (GB)

( * ) Notice: Subject to any disclaimer, the term of this patent is extended or adjusted under 35 U.S.C. 154(b) by 582 days.

(21) Appl. No.: 10/487,537

(22) PCT Filed: Aug. 23, 2002

(86) PCT No.: PCT/GB02/03898
§ 371 (c)(1),
(2), (4) Date: Sep. 9, 2004

(87) PCT Pub. No.: WO03/019589
PCT Pub. Date: Mar. 6, 2003

(65) Prior Publication Data
US 2005/0028347 A1    Feb. 10, 2005

(30) Foreign Application Priority Data
Aug. 24, 2001    (GB) .................................. 0120697.8

(51) Int. Cl.
*H01L 39/24* (2006.01)
*H01F 5/02* (2006.01)

(52) U.S. Cl. ................ 29/599; 29/605; 29/868; 427/62; 505/430; 505/470; 505/490; 505/704; 505/818; 505/822

(58) Field of Classification Search .................... 29/599, 29/605, 606, 868; 427/62, 63; 505/430, 505/431, 470, 490, 704, 818, 822, 473
See application file for complete search history.

(56) References Cited

U.S. PATENT DOCUMENTS

| | | | | | |
|---|---|---|---|---|---|
| 4,236,297 | A | * | 12/1980 | Lanig | 29/599 |
| 4,845,308 | A | * | 7/1989 | Womack et al. | 29/599 X |
| 4,965,247 | A | * | 10/1990 | Nishiguchi | 427/62 X |
| 5,225,394 | A | * | 7/1993 | Yamazaki | 427/63 X |
| 5,739,086 | A | * | 4/1998 | Goyal et al. | 505/473 |
| 5,898,020 | A | * | 4/1999 | Goyal et al. | 29/599 X |

FOREIGN PATENT DOCUMENTS

| | | |
|---|---|---|
| EP | 0286106 A | 10/1988 |
| EP | 0286410 A2 | 10/1988 |
| EP | 0298461 A1 | 1/1989 |
| EP | 0306287 A2 | 3/1989 |
| EP | 1 122 799 | 8/2001 |
| JP | 63291405 A | 11/1988 |
| JP | 1-276605 | * 11/1989 ........... 29/599 |
| JP | 4-324605 | * 11/1992 ........... 29/599 |

OTHER PUBLICATIONS

Selvamanickam, V., et al., Fabrication of Biaxially-Textured Thick Film Y-Ba-Cu-O Superconductor by MOCVD on Cube-Textured Metal Substrates, 1996.
Selvamanickam, V., et al., High-Current Y-Ba-Cu-O Coated Conductor Using Metal Organic Chemical-Vapor Deposition and Ion-Beam-Assisted Deposition, Sep. 18, 2000.

\* cited by examiner

*Primary Examiner* — A. Dexter Tugbang

(57) ABSTRACT

A method of fabricating a superconducting coil is provided which includes fabricating individual coil windings by depositing, shaping and texturing superconductive material in situ on a former which has a substantially curved surface.

30 Claims, 6 Drawing Sheets

Translation, during "beam writing"

rotation

Ion beam (stationary)

SUPERCONDUCTING COIL FABRICATION

This invention relates to superconducting coil fabrication, and to superconducting coils so fabricated.

Superconducting coils are currently manufactured by winding low temperature superconducting (LTS) wires around formers, and subsequently impregnating them with resin to provide an element of stability and protection. Reinforcing materials are often incorporated. The main advantage of a superconducting coil over a conventional copper-wound coil is that it consumes almost no power, whilst being able to develop high fields for a relatively small size. To date, the principal successful commercial applications have been superconducting magnets, such as:—

1. high field magnets (up to 21 Tesla) for physics research, especially solid state physics, and beam steering applications in particle physics;
2. high field magnets for nuclear magnetic resonance (NMR) for molecule identification, especially in the life sciences (eg for genetics research); and
3. whole body scanners using magnetic resonance imaging (MRI) for medical diagnostics purposes, using typically 3 or 4 Tesla magnetic fields.

The necessity for low temperature refrigeration of any devices using LTS wire has severely limited more widespread use of superconducting magnets—typical operating temperatures are between 2° and 20° K. For example, separation of materials using superconducting magnets is one area where higher temperature operations would be beneficial, and would probably lead to more widespread industrial uses. Other areas are catheter steering applications in medicine, and "small parts" MRI—for examining knees, elbows etc, where the use of "whole body" MRI scanners is unnecessary. Also many potential applications of superconductivity in devices other than magnets eg for the electric power and generation industry, have not been commercialised because of this requirement for low temperature operation.

During the last fifteen years since the discovery of high temperature superconductivity (HTS), frequent re-examination of both existing and potential markets for superconducting devices has taken place, and a number of demonstrator devices, such as motors and transformers, have been built using bismuth strontium calcium copper oxide (BSCCO) tape. Typically, fibres of the superconducting compound are embedded in a silver alloy matrix to form a flexible tape, and there are "dip coating" variants. Unfortunately, the performance of this material is not good in magnetic fields at the higher temperatures achievable using HTS, and the major use is likely to be restricted to power cables, because coils and windings inevitably generate field. Meanwhile, in the field of electronic applications, yttrium barium copper oxide (YBCO) thin films on single crystal substrates have been very successfully demonstrated, and commercialisation is already taking place, eg for narrow bandwidth filters for the base stations of mobile phone networks, and also in superconducting quantum interference devices (SQUIDs) for detecting and amplifying minute signals in instrumentation, eg in sensors for instrumentation used by earth scientists (eg for geophysical exploration) and in medicine (eg for recording brain activity).

However, single crystal substrates are neither long nor flexible, and the higher performance of the YBCO films has not yet been utilised in power devices such as transformers, generators and motors, but there has been a recent very important development. There is currently a major effort worldwide to produce long lengths of so-called "coated conductor" which consists of a flexible (usually metallic) tape substrate coated with a thin film of YBCO which is highly superconducting even at liquid nitrogen temperatures and in reasonable magnetic fields. Such a tape is shown in FIG. 1, which shows a nickel alloy substrate 1, a buffer layer 2 deposited on the substrate, and a YBCO film 3 deposited on the buffer layer. The layer 2 and the film 3 are deposited using techniques such as sputter coating, thermal evaporation or chemical vapour deposition (CVD). The substrate 1 is 10-100 microns in thickness, so as to be flexible but mechanically strong, the buffer layer is substantially 1 micron in thickness, and the YBCO film 3 is 1-5 microns in thickness for high Jc, high Je, excellent performance "in field", tight minimum radius bend and good mechanical stability.

As far as we are aware, no coils of coated conductor have been successfully wound, but this will certainly be possible when sufficiently long lengths of high-grade material become available. However, this "upscaling" process is likely to take several years, and meanwhile BSCCO tapes must be considered for high field applications, and comparatively low temperature operation will still be necessary. Even when YBCO tapes do become available in sufficiently long lengths, there is the drawback that YBCO films are, of course, ceramic, and therefore brittle in nature. This limits the amount of strain they can tolerate during coil manufacturing processes, including reeling and winding operations.

Thus, in the case of the well known "pancake" coil (see FIG. 2) layers of tape, insulated from each other, of course, are wound precisely on top of one another, and there is no lateral or shear strain on the tape. The winding thus resembles the winding of audio recording tape onto a reel of an old-fashioned tape recorder.

Each loop of winding generates a contribution to the overall magnetic field at the centre of the coil, the contribution of each loop being proportional to the current in the coil, All the loops are in series, and carry the same current, but the outer ones are at a greater distance from the coil centre and cannot make as much contribution. They are, therefore, progressively less effective in contributing field. Also, in most applications a more uniform field is required over a larger volume. A stack of pancakes with the same central axis is one way of achieving this but a more useful configuration for magnets, and for other devices with windings, is a "solenoid" coil (illustrated schematically in FIG. 3), where wire or tape windings 4 extend along a cylindrical former 5. In the conventional wire-wound case, the coil resembles a cotton reel, but the aspect ratio can easily be varied.

In FIG. 3, one layer of a helical tape winding is illustrated with no overlap between the turns. Of course, if the tape is insulated, the turns may overlap, just as the wire turns overlap in a conventional solenoid. Each successive layer when winding a solenoid necessitates a "layer turn", which is easy to do with wire, but much more difficult with tape, because of the necessity to subject the tape to shear forces in a controlled way so as not to destroy its integrity. In the case of YBCO coated tape, this is a major problem because of the brittle nature of the layers, and the degrading of the superconducting performance if any cracks are present.

There is a further problem in the case of LTS windings, whether solenoid or pancake, for very high field magnets. As successive windings on the outside of the coil are added, their effect on the field at the centre is further diminished by the fact that the inner windings are now bathed in the higher field, and this reduces the critical current they can carry, which in turn diminishes their contribution to the magnetic field. Thus, adding further outside turns to the coil, which requires substantial lengths of high quality wire, becomes progressively less effective at increasing the desired field. This "law of diminishing returns" has severe economic consequences for high field magnets for physics research and high field NMR magnets, and is the major driving force for examining the possibility of HTS materials, where the critical currents can be much higher in field.

An aim of the invention is to provide alternative, and improved, routes to the fabrication of superconducting coils.

The present invention provides a method of fabricating a superconducting coil, the method comprising the step of fabricating individual coil windings by depositing, shaping and texturing superconductive material in situ on a former which has a substantially curved surface.

Preferably, the former defines a substantially cylindrical surface. In a preferred embodiment the former defines a substantially right circular cylindrical surface.

Advantageously, the method further comprises the step of depositing and shaping buffer layers between successive coil windings.

Preferably, the superconductive material is deposited on the former by a film deposition technique, and the buffer layers are deposited by a film deposition technique.

In a preferred embodiment, the method comprises an initial step of forming a spiral of textured buffer layer on the former, and the textured buffer layer is formed by helically positioning a flexible textured tape onto the former.

In another preferred embodiment, the spiral textured buffer layer is formed by a film deposition technique.

In a preferred embodiment, the film deposition technique includes the step of forming a spiral of textured buffer layer on the former, depositing a superconductive layer over the spiral buffer layer to form a first coil winding, depositing a second buffer layer onto the superconductive layer, and depositing a second superconductive layer onto the second buffer layer, thereby forming a second winding of the coil, and repeating the buffer layer and superconductive layer depositions to form as many coil windings as required, each deposition process being such as to transfer the texture of the underlying layer to the newly-deposited layer. In this case, the spiral of textured buffer layers may be written onto the former using the IBAD technique using a fixed ion beam or the alternative methods of ISD, IAD or any other suitable variant and rotating and translating the former. Alternatively, the deposition source (eg the ion beam) is translated and the former is rotated but not translated. Another possibility would be to form a buffer layer completely overlying a textured cylindrical former, and then removing a spiral track of the buffer layer (for example lithographically) to form the spiral of textured buffer layers.

Conveniently, each of the superconductive layers is an YBCO layer. Alternatively, each of the superconductive layers is any other suitable superconducting film such as a rare earth barium copper oxide (ReBCO) film.

Advantageously, after the addition of a predetermined number of coil windings, a reinforcement shell is formed on the coil, a textured spiral is formed on the surface of the reinforcement shell to define a further buffer layer using the same process as used on the original buffer layer, and then further coil windings are deposited by the addition of sequential superconducting and buffer layers.

Preferably, the method further comprises providing connecting links to connect the ends of adjacent coil windings. Conveniently, the connecting links are provided within the former, and each includes a fault current limiter.

Advantageously, the deposition steps take place in a film deposition chamber, and deposition of the buffer layers occurs from one side of the chamber, and deposition of the superconductive layers occurs from the opposite side of the chamber, and the former is rotated during the deposition process. The two sides of the deposition chamber may be separated by baffles.

In another preferred embodiment, the former is provided with a textured cylindrical surface, and with a spirally-wound heater winding wire, the turns of which are spaced by a means of spacing, the means of spacing being the diameter of the wire or grooves in the former, a first buffer layer is deposited to form a spiral buffer layer track between the turns of the heater winding, an super-conductive layer is deposited over the first buffer layer, and a further buffer layer is deposited on top of the superconductive layer to form a first coil winding, a second heater winding wire is wound between the turns of the first heater winding wire, the first heater winding is removed, and a second coil winding is formed, the second coil winding being constituted by a first deposited buffer layer, a deposited superconductive layer and a second deposited buffer layer, and the process is repeated to form additional coil windings as required, each deposition process being such as to transfer the texture of the underlying layer to the newly-deposited layer. In terms of texture or superconducting performance.

The method may further comprise the step of circulating coolant within the former, and/or of testing, in situ, each coil winding.

The invention also provides a method of making a multi-layered textured superconducting coil, the method including the steps of fabricating superconductor coil windings and insulating layers by film deposition means, whereby the films are patterned by masking or machining operations before or after film deposition, in-situ or ex-situ, and/or by subsequently patterning using lithographic techniques allowing a tailoring of coil properties by controlling the geometry (width, thickness, spacing, or pitch) of the superconducting paths at every point on the surface.

The invention further provides a method of fabricating a superconducting coil, the method comprising the step of helically positioning a flexible coated tape onto a substantially cylindrical former, the coated tape being constituted by an insulating buffer layer insert on a flexible tape substrate and a coating of superconductive material.

Advantageously, YBCO constitutes the superconductive material, and the tape is a textured substrate made, for example, by the RABiTS process.

Preferably, the former is generally barrel-shaped, with tapered portions at each end of a cylindrical control main portion.

The invention will now be described in greater detail, by way of example, with reference to FIGS. 1 to 15 of the drawings, in which.

Figure 4:
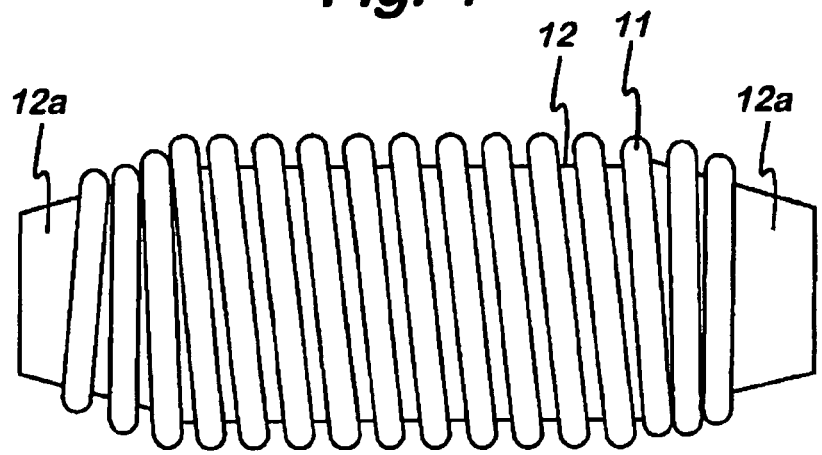
FIG. 4 is a schematic representation of a first form of coil constructed in accordance with the invention, the coil being shown at an early stage of construction.

Referring to the drawings, FIG. 4 illustrates an early stage of construction of a first form of superconducting coil. This coil is formed by winding a YBCO coated tape 11, or a tape coated with a material other than YBCO which exhibits similar high temperature superconducting properties, or other form of superconducting tape eg powder in tube (PIT) BSCCO onto a generally cylindrical former 12. The former 12 has tapered portions 12a at each end thereof, so that the former is generally barrel-shaped. The tape 11 is helically wound onto the former 12 so that, as the tape encounters a tapered end portion 12a, the "outer edge" of the tape (the edge furthest away from the direction of translation of the winding) will experience a small force tending to impart a slight twist, which naturally takes the tape back in the direction from which it came. As shown in FIG. 4, the pitch of the winding consequently narrows so that, after a few turns on the tapered end portion 12a, the tape will start to "climb" the taper and the transverse direction of winding will have been reversed. Consequently, a second layer of winding automatically starts without the need for any excess sheer strain in the plane of the tape, or complex winding control. Winding of the tape 11 continues until the tape encounters the other tapered end portion 12a which, in a similar manner, reverses the direction of winding of the tape. The winding of the tape continues backwards and forwards until the winding is complete. It should be noted, here, that the direction of the current which will flow in the completed winding will be the same for all winding layers. This shaped former 12 facilitates the winding of the superconducting tape 11, enabling the production of a multi-layer coil using a long continuous length of tape without undue strain on the tape as it is wound.

Figure 5:
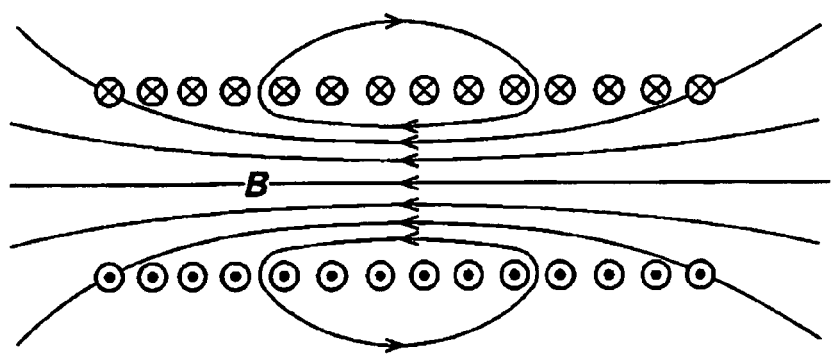
FIG. 5 is a diagram showing the magnetic field geometry of the coil of FIG. 4.

By appropriate choice of the angle of taper, and the precise geometry of the former 12, commensurate with the geometry of the tape 11 (whose width and thickness are important factors), the correct aspect ratio of the coil can be preserved. The more closely-spaced windings at the end of the coil will impart an "end correction" to the magnetic field near the coil ends. The effect of this is to make the field lines straighter, and hence more uniform over a greater volume, as is illustrated in FIG. 5, which shows the magnetic field geometry of a coil constructed in this manner. Thus, the field lines emanating from a normal uniformally-wound solenoid resemble those from a long bar-shaped permanent magnet. Increasing the current density at the end of the solenoid, by decreasing the winding pitch as shown in FIG. 4, straightens out (strengthens) the field lines, thus increasing the uniformity of magnetic field for the same length of coil. A tailored "end correction" can thus be achieved. The magnitude of the effect depends on the angle of taper of the end sections 12a of the former 12, and the width and thickness of the tape 11 relative to the winding pitch.

The YBCO coated tape 11 must be very well textured, that is to say its structure should be as near to that of a single crystal as possible. The "c" axis of all the grains must be aligned in essentially the same direction, close to the normal of the plane of the film deposition, and the number of high-angle grain boundaries in the ab-plane must also be minimised, since these act as a "weak links" or obstructions to the percolative supercurrents. Such obstructions are to be avoided, as the current tries to go around them.

Figure 1:
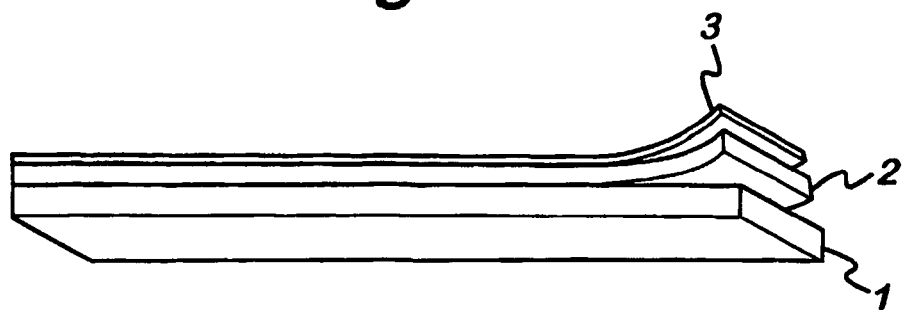
FIG. 1 is a schematic representation of a conventional long length coated conductor consisting of flexible tape substrate coated with a thin film of YBCO.

In order to achieve this well-oriented texture, the flexible substrate 1 (see FIG. 1) itself must be textured (using, for example, the so-called RABiTS approach or a variant of this approach) thus imparting texture to the subsequent buffer layer 2 and the YBCO layer 3. Alternatively, if the substrate 1 is randomly oriented, then some means must be found to produce texture for a buffer layer sequence on top of which an oriented YBCO layer 3 can be deposited (using, for example, the so-called IBAD or IAD or ISD approaches or variants of these approaches). Otherwise, the superconducting properties will resemble those of bulk material, rather than the much higher performance thin films deposited on single crystals for superconducting electronics applications.

Figure 6:
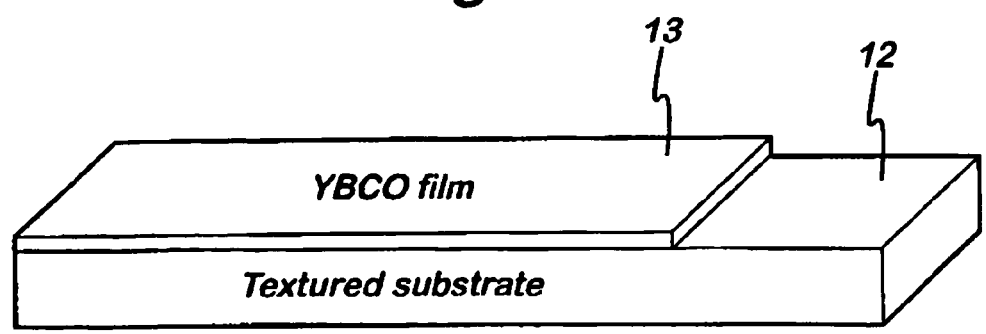
FIG. 6 is a schematic representation of a coated conductor tape which can be used to form the turns of the coil of FIG. 4.

FIG. 6 shows a section of YBCO coated tape made by the RABiTS process. This process consists of fabricating a textured substrate 12 by a series of rolling/reduction operations and heat treatments on nickel and nickel alloys, which have the correct cubic latice and atomic spacing for successful subsequent YBCO growth (as indicated by the reference numeral 13). Buffer layers between the substrate 12 and the YBCO layer 13 are required to prevent diffusion of unwanted chemical species between the substrate and the YBCO layer and vice versa. Typical buffer layers are cerium oxide (CeO) and yttrium stabilised zirconia (YSZ), palladium (Pd), silver (Ag) or any other suitable material which exhibits the physical and physicochemical properties required of the buffer layer. The result is a tape, typically 50-100 microns thick, having excellent texture, with the grains all having their c-axes pointing in the 100 direction, and having very little in-plane mis-orientation in addition.

Another known way of obtaining the necessary texture is to start with a highly-polished surface (typically an Inconel tape) and to deposit, for example, YSZ in the presence of an ion beam impinging on the substrate at a specific angle, which has the effect of inducing texture in the growing YSZ film. Shadowing effects and channelling effects have been suggested as explanations for this textured growth on amorphous or polycrystalline substrates; and, in one technique, sometimes referred to as ISD (inclined substrate deposition), evaporation or pulsed laser deposition of buffer layers is achieved, again at specific angles, but without the need for an ion beam. Schemes using sputtering to produce the required conditions at the surface have been studied also —ion assisted deposition (IAD) is one example. The aim is always the same—to produce a textured layer on top of which highly superconducting YBCO films can be grown. The advantage of starting with an untextured substrate is that the substrate can be mechanically very strong and, therefore, thinner; which means that the engineering current density can be higher than for a RABiTS coated conductor for the same YBCO film properties. ("Engineering current density, Je" equals the total current carried by the film, Ic, divided by the whole cross-sectional area of the conductor, including that of the substrate. It is, therefore, considerably less than the current density of the YBCO film itself, where Jc equals Ic divided by the cross-sectional area of the film only.)

Whilst YBCO films have much higher current density than BSSCO tapes, this current density is "diluted" by one or two orders of magnitude because the substrate thickness is typically 10 to 100 microns, whereas the typical YBCO film thickness is one micron, and Jc is 10E6Acm-2. Nevertheless, the engineering current density is still adequate for many purposes; and, if the temperature is reduced, the current carried by the overall conductor structure will increase considerably. BSSCO tapes can be manufactured in long lengths and are commercially available, but they do not exhibit "true" superconductor behaviour because they have some residual resistance and cannot maintain "persistent" currents. Nevertheless, they are suitable to manufacture coils of the type shown in FIG. 4, even though not as suitable as YBCO coated tapes.

Figure 7:
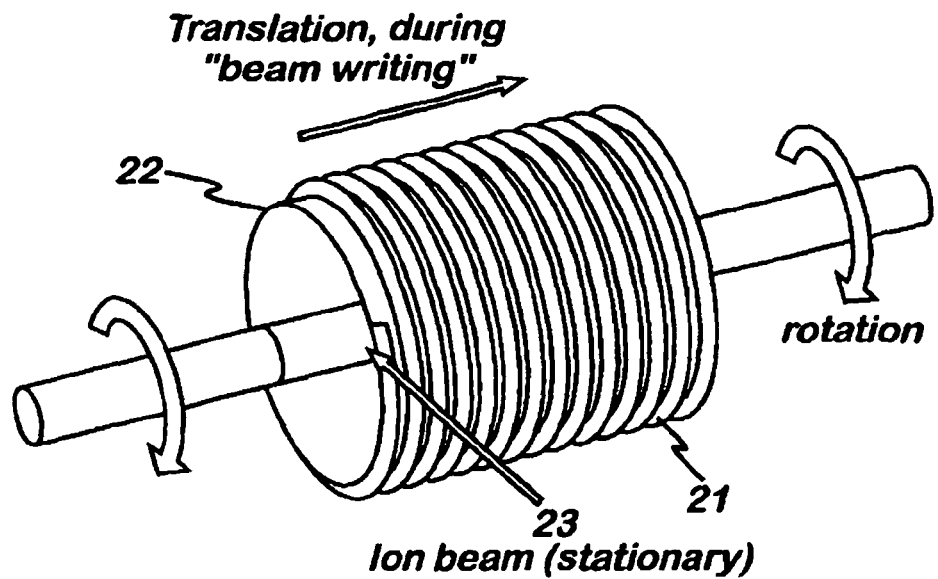
FIG. 7 is a schematic representation of a second form of coil constructed in accordance with the invention, the coil being shown in an early stage of construction.

FIG. 7 illustrates an early stage of construction of a second form of superconducting coil. This consists of the "writing" of a spiral 21 of textured buffer layer on a cylindrical former 22 using the IBAD technique, by using a fixed ion beam (indicated schematically by an arrow 23) and rotating the former at the same time as translating it—resembling a screw thread cutting operation using a lathe with a "lead screw" which feeds the cutting tool into a work piece. This step can be followed by the MOCVD (metal organic vapour deposition) or other process to deposit a YBCO layer (not shown) over the entire cylindrical surface of the former 22, whilst the former is rotated for uniformity of deposition. Where the YBCO layer overlies the spiral buffer layer 21, it copies the texture of that underlying buffer layer, and so will be highly superconducting. Where the YBCO layer is deposited on non-textured regions, the superconductivity is two orders of magnitude lower, and can be ignored. In this way, the first layer of a solenoid coil is formed. If necessary, a laser or mechanical scriber (not shown) can be used to cut an isolating region between the highly superconducting turns.

Another insulating buffer layer (not shown) is then deposited, using any one of a variety of techniques—without using the slow IBAD process, because the buffer layer copies the form of the surface which it overlies. Thus, where the buffer lies on a textured YBCO surface, the buffer will have a textured surface; and, where the buffer lies on an untextured YBCO surface, the buffer surface will be untextured. Another YBCO layer completes the second "winding" of the solenoid, as the new YBCO surface copies the form of the buffer layer which it overlies, and so on until a multilayer solenoid, consisting of concentric cylindrical shells, is built up without the need for a long textured tape. It will be appreciated that the slow IBAD process is only used for the initial textured buffer layer, and after the provision of each reinforcement shell.

Figure 8:
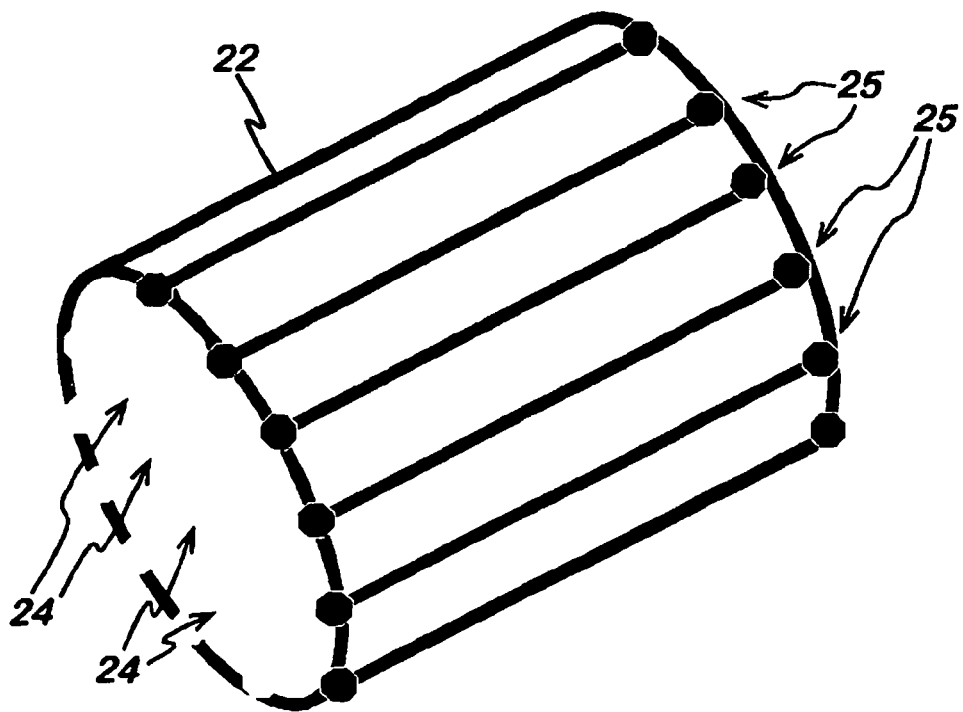
FIG. 8 is a schematic representation of a cylindrical former for use with the coil of FIG. 7.

Of course, the coil layers have to be connected together, either in series or in parallel, and pre-deposited tracks of YBCO or even BSSCO tapes located inside the former 22 may be used to make this connection. FIG. 8 illustrates schematically the former 22 provided with connecting links 24 connected to bond pads 25 provided at the ends of the individual windings. The connecting links 24 may be short lengths of tape located within the former 22 on the inside or the outside, before or after film deposition, or they may be tracks of YBCO film deposited before the main coil deposition. The former 22 may be grooved, inside or outside, to accept the links 24, and there may be slits cut at an angle at the ends of the former to allow connection of the tracks to the coil ends. A shaft encoder (not shown) is used to control accurately the exact rotational position of former 22, thereby permitting precise control of the start and end of each of the "windings", and hence co-location of these starts and ends with the bond pads 25.

For some applications, it would be preferable to introduce some protective circuitry, again integral with the coil, in order to protect the device, or part of the device, against a superconductivity "quench". For example, if the coil were to be the inner coil of a much larger, conventional superconducting magnet in order to boost the latter's field; then, if the outer sections quenched, the so-called "insert coil" would experience a massive rate of change of flux and hence a massive induced current. This would lead to the destruction of the device.

In order to prevent this happening, the arrangement of FIG. 8 is modified by including an FCL (fault current limiter) in each layer of the coil. Such FCL devices exist in thin film form already, and could be integrated with the coil, either by patterning the ends, or by making "weak links" (layer connections) between the layers, perhaps positioned inside the former 22 before deposition begins. These weak links will fail before the layers fail, thereby preventing the occurrence of the massive induced currents referred to above. This is because an FCL permits the passage of only a predetermined amount of current, and so will fail before coil destruction, provided the predetermined current is chosen to be less than that which would lead to coil destruction.

Figure 3:
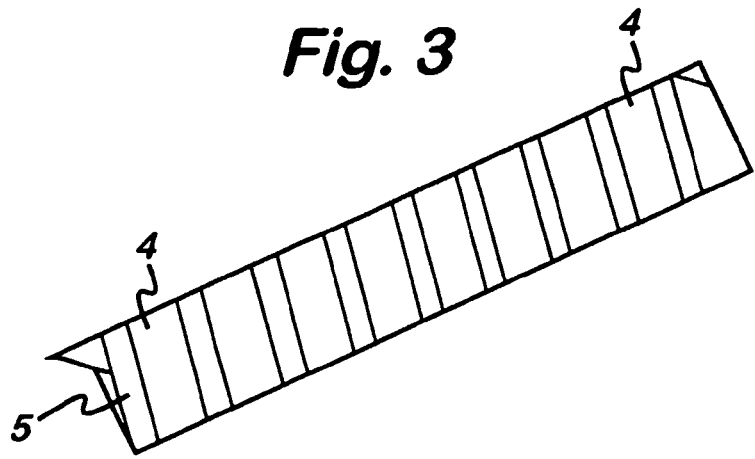
FIG. 3 is a schematic representation of a conventional solenoid coil.

A modification of the coil fabrication technique described above with reference to FIG. 7 would be to use the length of textured tape (coated or uncoated) to establish the initial textured spiral buffer layer 21. This layer 21 would, therefore, resemble the winding shown in FIG. 3.

Figure 2:
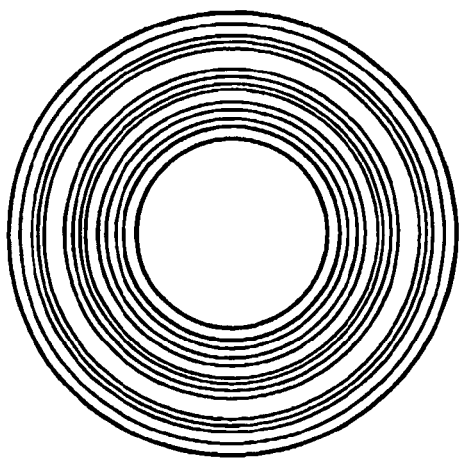
FIG. 2 is a schematic representation of a conventional pancake coil consisting of layers of tape insulated from each other.

A further embodiment of the invention, which is described, by way of example, for the coil fabrication technique described above with reference to FIG. 7, would be to introduce a shell to reinforce the mechanical strength of the coil, and to ensure that after a number of multi-layer coil windings the textured region does not degrade. The reinforcement shell could be deposited after the deposition of a number of buffer and superconducting layers, say for example ten, where the cross-section of the coil would appear much like that of FIG. 2, consisting of concentric cylindrical layers. The outside surface of the reinforcement shell, once deposited, would require texturing using the same technique as for the texturing of the initial buffer layer. One method that could be used to deposit the reinforcement shell would be to position the shell during a shrink-fitting operation. The coil fabrication technique proceeds as described above, until a similar number of layers are deposited, say for example ten. This process can then be repeated to produce concentric reinforcement shells within a concentric solenoid, constituting the coil.

The sections of the concentric solenoid between the concentric reinforcement shells require an interconnection scheme, as between the individual layers of the superconducting coil described above. This interconnection scheme would take the form of an FCL device, which would be more economical than having an FCL for each layer of the superconducting coil. As described above for the FCL devices integrated with each layer of the coil, the FCL devices for the section of concentric solenoid would decouple sections of the coil in the event of a superconducting quench.

Figure 9:
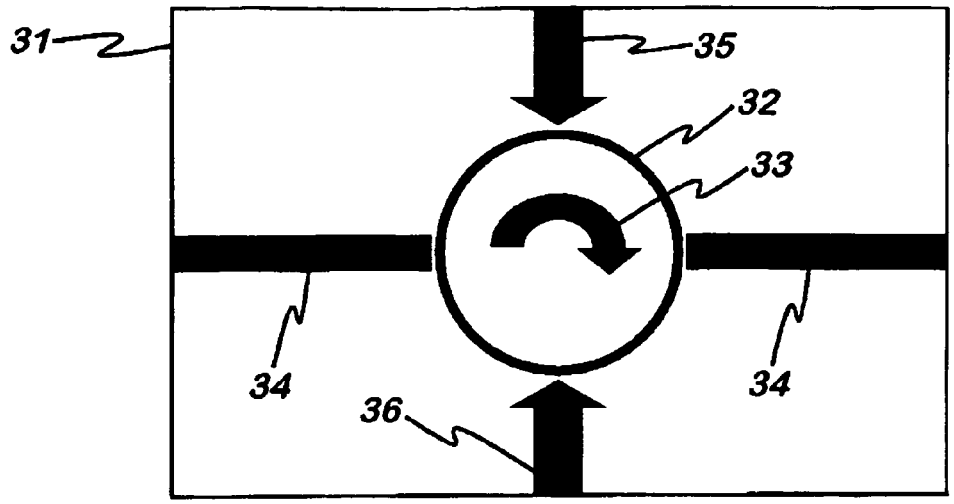
FIG. 9 is a schematic representation of apparatus for forming a modified version of the coil of FIG. 7.

FIG. 9 shows schematically apparatus for forming a modified version of the coil of FIG. 7. This apparatus comprises a film deposition chamber 31 which houses a rotatable cylindrical former 32 which is similar to the former 22 of FIG. 7. The former 32 is rotatable in the direction of the arrow 33, and the chamber 31 is divided into two portions by means of baffles 34. A textured buffer layer (of for example CeO) is deposited on the former 32 by a "line-of-sight" evaporation process, indicated schematically by an arrow 35, whilst YBCO deposition proceeds by a similar "line-of-sight" evaporation process on the other side of the rotating cylindrical former, as indicated schematically by an arrow 36. The baffles 34 help maintain the required differential pressures in the two portions of the chamber 31.

As the former 32 is rotated, the depositions proceed in parallel with the result that a "Swiss roll" geometry of YBCO and insulating buffer layers is formed. This process is ideal for forming a "pancake" coil.

Figure 10:
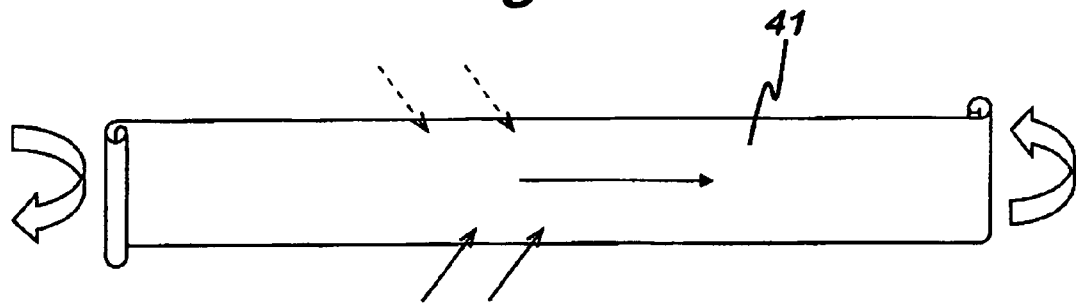
FIG. 10 is a schematic representation illustrating the formation of a third form of coil constructed in accordance with the invention.

FIG. 10 illustrates schematically a coil formation technique which is intermediate the "long coated conductor" technique of FIG. 4 and the direct in situ film deposition technique of FIGS. 7 and 9. In this case, a coil is formed in situ by unwinding a reel of a textured flexible substrate 41 formed using the RABiTS approach, and rewinding the sheet onto a former (not shown) to fabricate the coil. The sheet 41 could have both sides thereof formed with a textured coating.

Bearing in mind that deposition temperatures play an important role in the formation of film layers, and that the mechanical properties of a long coated tape which is used as an initial winding layer vary significantly with temperature, this intermediate technique can prove advantageous compared with the two-stage process described above.

Figure 11:
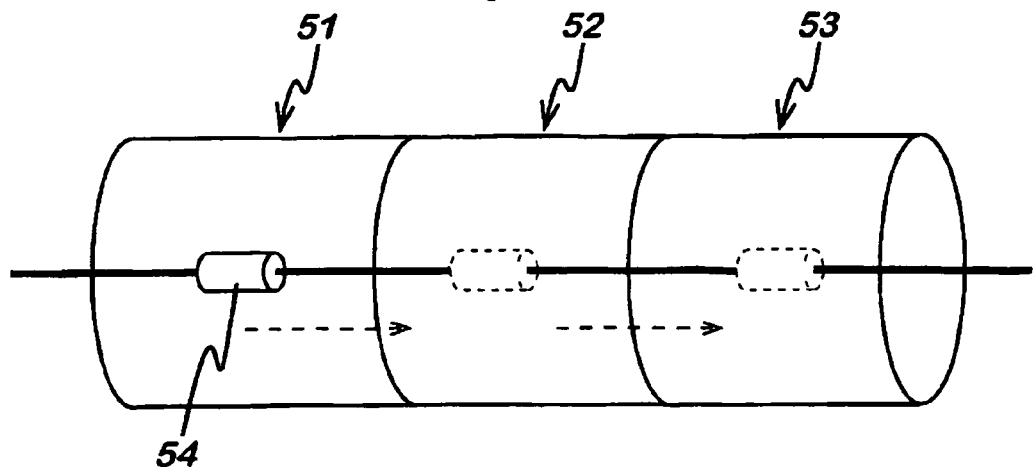
FIG. 11 is a schematic representation of apparatus for fabricating a coil of the type shown in FIG. 7.

In any fabrication process using film deposition techniques, heat treatments are inevitably involved, either simultaneously with layer deposition, or after the film deposition process, and the control of oxygenation conditions during such heat treatments is crucial. Rather than having a single film deposition chamber, and having to insert and withdraw the former many times during the coil fabrication process, it is preferable that different processes are carried out in different interconnected chambers. Thus, as shown in FIG. 11, the apparatus of FIG. 9 could be modified to provide three contiguous treatment chambers 51, 52 and 53. The cylindrical former 54, upon which a coil is to be fabricated, can be shuttled to and from the various chambers 51, 52 and 53 for different treatments, such as film deposition, heat treatment, oxygenation, formation of layer interconnects etc. Thus, the chamber 51 could be for buffer layer deposition, the chamber 52 for YBCO deposition, and the chamber 53 for brazing/handling operations for the interconnects between layers etc. Each of the chambers 51, 52 and 53 is provided with a window (not shown) to allow operator intervention, but it will be appreciated that the majority of processes are under computer control. One of the chambers could also be used for forming a textured surface on the cylindrical former 54, using any of a number of processes, including "melt-spinning", where a surface is rotated rapidly while molten metal is sprayed onto it, thereby ensuring that rapid solidification results in a textured finish.

As described above, the different chambers, 51, 52 and 53 of the apparatus of FIG. 11, can be used to apply different treatments and processes to the coil as it is made. This method is one embodiment of many that can be used to process and heat the coil during its manufacture. One aim of these processes and treatments is to control the oxygen content of the coils. The oxygen stoichiometry in the layers affects the properties of the superconducting coils. If oxygen is present in the wrong proportion, with respect to the other constituent elements of the superconducting layer, the, superconducting coils will no longer superconduct. So the oxygen content needs to be present within precise limits. However, depending on temperature and chemical potential, oxygen moves within the atomic lattice structure of the buffer and superconducting layers of the coil, and the coil structure could contain buffer layers that are oxygen sources, oxygen sinks, oxygen gateways, oxygen barriers and, as the situation demands, layers that are permeable to oxygen. The properties of the buffer layers are particularly dependant upon the temperatures of their deposition, their heating rates, their cooling rates immediately after deposition, and their other time-temperature histories during processing.

The most likely geometry for coil fabrication using the film deposition technique is to carry this out on a rotating cylindrical former provided with an integral, preferably internal, heating element. This arrangement would ensure that most of the heating requirements are supplied to raise the temperature sufficiently to ensure the correct epitaxial deposition of layers. If necessary, an additional radiation heating arrangement could be supplied. The temperature during a film deposition process must be closely controlled, and this is particularly difficult where a long flat conductor is being processed. However, as is the case with film deposition of a cylindrical former, the presence of an axis of symmetry lends itself to a much better control of uniform heating, for example, by incorporating heating elements inside the cylindrical former, or embedding these in the walls of the cylindrical former. Such heating elements may be, for example, tungsten coils or halogen lamps. Complementing this heating arrangement by the use of radiation heating impinging on the external surface of the cylindrical former is also useful for process control, with the main heating being done internally, but the "fine tuning" heating being carried out using external radiation heating methods.

Figure 12A:
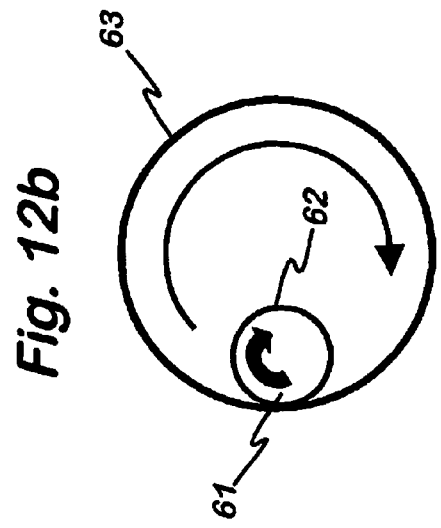
FIGS. 12a and 12b are schematic representations of apparatus for directly inducing texture on cylindrical surfaces.
Figure 12B:
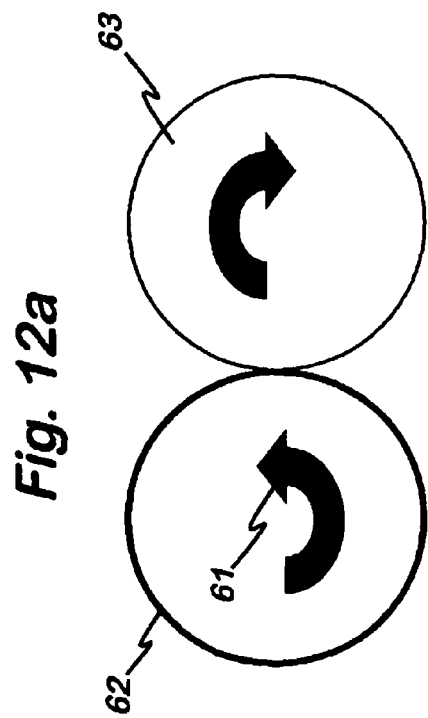

FIGS. 12a and 12b are schematic representations of apparatus for forming coils by directly inducing texture on cylindrical surfaces including the process of extrusion. FIG. 12a shows a cylindrical former 61 around which a sheet 62 of RABiTS material has been wrapped. The sheet 62 is then subjected to rolling and heat treatments using a second (heated) cylinder 63, this treatment eliminating the join in the sheet. Alternatively, the two cylinders 61 and 63, thus being a process of performing the texturing in situ.

FIG. 12b shows a modification of the apparatus of FIG. 12a, in which the cylinder 61 rotates inside a drum 63 of large diameter. Here again, a sheet of RABiTS material 62 may be wrapped around the cylinder 61, and the join eliminated by rolling and heat treating, or the texturing process maybe carried out in situ by rotating the two cylinders 61 and 63 relative to one another under pressure to induce texture. The arrangement of FIG. 12b is actually preferable to that of 12a, as the stresses formed at the surface of the cylinder 61 are more like the conditions reached during the rolling of RABiTS tape.

In another modification of the apparatus in FIG. 12a, the material on the surface of the cylinder 61 is subjected to rolling and heat treatments by a series of cylinders, each of which, as cylinder 62, is in contact with the surface of cylinder 61. The series of cylinders texture the material on the surface of cylinder 61 by extrusion in the sense of swaging or drawing the surface of cylinder 61 through a die. The effect of this process is to extrude cylinder 61 along its length. By a further modification of this apparatus, the series of cylinders each rotate about an axis perpendicular to the axis of cylinder 61.

Figure 13:
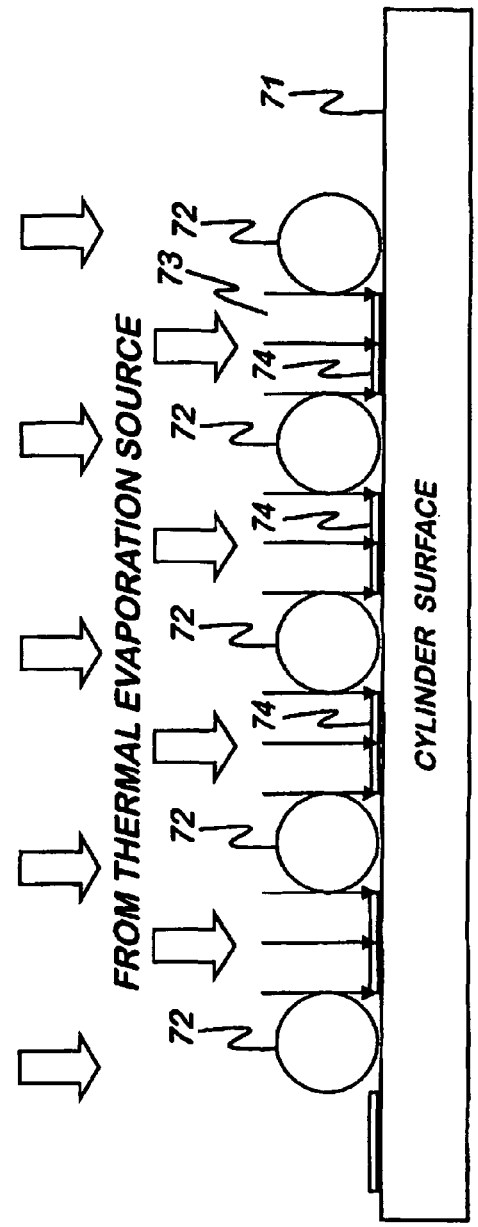
FIG. 13 is a schematic representation illustrating the fabrication of a coil on a cylindrical surface of the type shown in FIG. 12.

Another form of coil fabrication process will now be described with reference to FIGS. 11 and 13-15. In this embodiment, a textured cylinder 71 (the cylindrical surface only of which is shown in FIG. 13) is co-wound with two tungsten wire heater elements, one of which is immediately unwound leaving an evenly-spaced heater winding 72 in place in contact with the surface of the cylinder, and a "spiral gap" 73 elsewhere. The heater winding 72 acts as a "shadow mask" during the process described below.

The cylinder 71 is then placed inside the deposition chamber 51 of the apparatus of FIG. 11, and is coated with a first buffer layer 74 (see FIG. 13) using the heater winding 72 to achieve the correct deposition temperature. As with the earlier film deposition embodiments, the cylinder 71 is rotated during deposition. The buffer layer 74 is deposited using a thermal evaporation source, as indicated by the arrows shown in FIG. 13. This process copies the texture from the cylinder 71. Obviously, that part of the cylinder 71 masked by the heater winding 72 does not receive a buffer layer, so that the situation at this stage is as illustrated in the cross-sectional view of FIG. 14. The buffer layer 74 thus forms a spiral track between the turns of the heater winding 72.

The cylinder 71 is then moved into the chamber 52 of the apparatus of FIG. 11, where it receives a YBCO coating, again with that part of the cylinder underneath the heater winding 72 being left uncoated. This process copies the texture from the buffer layer 74 to the YBCO layer (not shown in FIGS. 13 and 14). The cylinder 71 is then passed back to the chamber 51, where it receives another buffer layer on top of the spiral YBCO track which then exists. The cylinder 71 is then passed to the chamber 53, where it is re-wound with the second heater element (not shown), after which the first heater winding 72 is removed, thereby leaving the spiral YBCO track with an insulating textured buffer layer on top, as the first "coil winding". Spaces are left in between the spiral coil winding turns which are uncoated, bare cylinder of the same dimensions as the spiral track.

The cylinder 71 is then returned to the chamber 51 and receives another insulating buffer layer. This layer is deposited on top of the previously-masked part of the bare cylinder. Subsequently, a YBCO film is deposited in the chamber 52, and the cylinder 71 is then passed back to the chamber 51 for application of another buffer layer. The cylinder 71 is then passed to the chamber 53, where the first heater winding is re-wound and the second heater winding is removed. Connections between the first and second windings can be made using a similar scheme to that shown in FIG. 8, this process being carried out in the chamber 53. At this point, there are two YBCO layers in the form of windings, both with textured insulating buffer layers on top. One of them is covered with a heater element, the other is not. The whole process can now begin again, changing the heater element position each time so that a multi-layer structure of YBCO "windings" is formed, with the necessary connections between them. The windings are, in effect, interlaced. This position is shown schematically in FIG. 15, which show the cylinder 71, the buffer layers 74 and the YBCO layers 75 of a finished coil formed in this manner.

Figure 14:
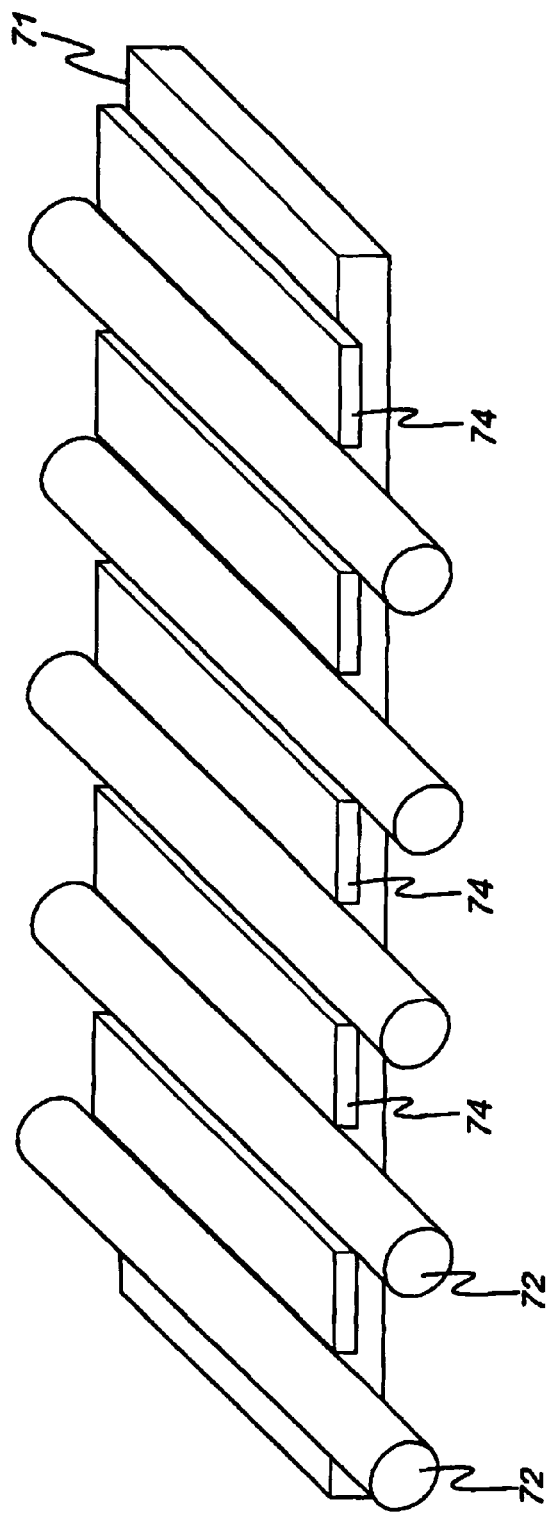
FIG. 14 is a schematic representation illustrating the turns of a coil constructed in accordance with FIG. 13.
Figure 15:
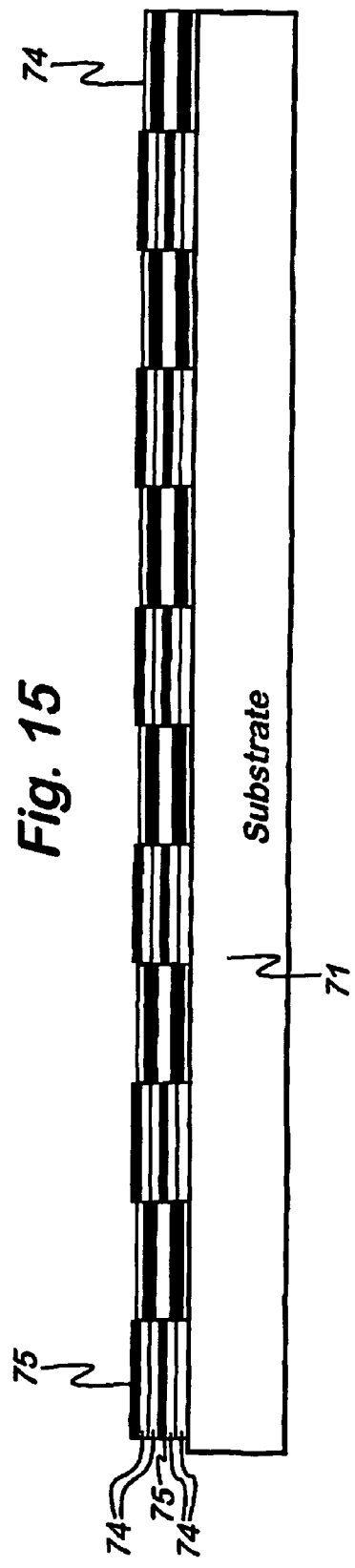
FIG. 15 is a schematic representation illustrating a four-layer coil.

The diameter of the heater windings maybe typically 200-500 microns, whereas the layer thicknesses are generally of the order of a few microns. In this connection, it will be appreciated that FIGS. 13-15 are not drawn to scale; but, if the sources for thermal evaporation are some centimetres away, this gives a sharp masking effect with very little "penumbra" effect. It will also be appreciated that, during depositions steps subsequent to the first, the position of the next heater winding will be displaced exactly by the diameter of the wire of the heater windings.

The structure shown in FIG. 15 forms a simple, four-layer coil, and the layers must be connected, either in series or in parallel, depending upon the preferred power supply. Thus, for a series connection, the cylinder ends can be in the form of film FCLs (either pre-deposited or post-deposited), such that the layers are connected through the FCL film devices. In order to maintain the same direction of current through the spiral YBCO tracks comprising the "coil windings", each layer must be connected to the opposite end of the next layer, via some internal superconducting link via a respective FCL device.

As an alternative to the scheme described above, after the first YBCO layer and buffer overcoat have been deposited, the sense of the next heater winding is reversed so that successive YBCO layers can be connected to each other without the type of axial superconducting lengths shown in FIG. 8. This gives the effect of a "layer turn" in a conventional wire-wound solenoid. The essential point here is that the original texture of the cylinders surface must be copied with each successive layer, whatever the precise geometry or manufacturing process.

The heater windings themselves may be deposited using film deposition techniques at each stage, and can be removed using an etching process after photolithography. In this sense, they would be "sacrificial" rather than reusable as was the case with the process described above.

Another variation, would be to cut a spiral groove in the textured cylinder surface and to use this to embed a heater winding, with the winding standing proud of the surface. A textured multilayer structure is then built up on the adjacent sections, geometrically similar to the scheme of FIG. 8, and the heater winding can be removed after the final deposition stage. This simplifies the process, but does not achieve quite the same current density as the co-wound, double heater winding approach described above.

Finally, the delineation of the coils may be accomplished using photolithographic techniques, and a careful choice of the chemical etchants to distinguish between etching of the buffer and YBCO layers. In this way, "etch stop" techniques can be used, which increases the tolerance of the processing.

In any of the techniques described above, film deposition can be accomplished using the so-called "dip coating" or other "thick film" technique, whereby the film is supplied by rotating the cylinder in a solution of, for example, sol-gel of cerium oxide.

The coil fabrication techniques above all refer to the use of a substantially cylindrical former. As a modification of this fabrication technique, coils can be manufactured upon any curved surface, including a saddle, a cone, a surface having a concave rather than a convex surface, a surface with negative curvature rather than a surface with positive curvature, and a surface that does not have an axis of rotation.

The films that are described in the above methods are of the order of micrometers. Typically thin films, as used in the semiconductor industry or for optical coatings, are a few hundred nanometers thick. Thick films, on the other hand, as used in printed circuit boards, are tens to hundreds of microns thick. Here, the HTS films fall between the definitions of thick and thin films.

Since the HTS and buffer films have a thickness that lies between the definition of thin films and thick films, both thin film deposition methods such as evaporation, sputtering, MOCVD, and thick film deposition methods, such as "dip-coating", spray pyrolysis and, spin coating can be used to make HTS films. However, in practice, it should be borne in mind that a concentric solenoid with 100 thick layers is likely to be easier to manufacture than a concentric solenoid with 1000 thin layers.

There a number of very important consequences of film deposition techniques which do away with the superconducting wire and winding processes which are traditionally used in manufacturing coils, namely:—

1. The definition of a coil, using planar technology such as photolithography, etching etc, can be done after the film deposition, rather than as part of the winding process. This lessens the mechanical constraints such as the introduction of defects by bending the wire etc, which are inevitable through handling and coil winding procedures. It also means that the same basic coated formers may be used to fabricate a variety of structures—e.g. coils of different track width, different "winding pitch", or even variable winding pitch to modify and control fields more precisely. The latter is an important point, as normally the winding of a coil is constrained by the diameter of wire, length of coil, number of turns etc, but the new processes described above give extra degrees of freedom for end corrections, to take but one example. The geometry of the "windings" in the new approach is obviously much more flexible, and not constrained by the diameter of the wire etc.

2. Coil windings are conventionally impregnated with resin to stop them from moving under the high magnetic fields generated. A high field superconducting magnet can be regarded as a pressure vessel subject to enormous forces trying to explode the containment. Hence, there are many reinforcing strategies. The overall mechanical integrity of the windings is an important factor in nearly all applications, and again the new ideas, which essentially embody an "integrated manufacturing approach" are a significant advance. Thus, each layer of coil is bonded to each underlying layer by the immensely strong atomic bonding forces rather than by friction, tension etc as in conventional windings. Control of tension and angles of wire during winding are critical factors which are completely eliminated using the new approach. Also, a former with initial grooved structure might also give added strength to the overall component. Such grooves may also serve to "register" subsequent layers by use of a "throwaway" heater winding approach described above.

3. Conventionally, insulation is introduced alongside the wire either in a "co-wound" configuration or as a sleeve. In the new approach, the insulation using films as "buffer layers" is an integral part of the structure. Typically, each layer of YBCO will be sandwiched between textured insulating layers. The texture is copied from one layer to another, and film technology minimises the number of defects in both insulating and superconducting layers. This is comparable to the case of silicon technology, where many different layers comprise the overall circuit. However, in the present case, the texture of the layer must be copied from one layer to another as in the case of a solid state laser heterostructure.

4. A "layer verification" strategy can be incorporated, whereby XRD (X-ray diffraction) and ion beam or electron beam techniques (such as ion beam or electron channelling patterns) are used to verify each layer as it is being formed. Also, since the film deposition is likely to be performed in a vacuum chamber, it would be possible to verify the superconducting properties of the coil during manufacture by cooling the coil, e.g by passing liquid nitrogen through a hollow shaft or channels in the former supporting the coil, and by measuring the electrical/magnetic properties to verify each superconducting layer, for example. Since the final fabricated coil must also be cooled in use, this incorporation of channels for liquid or gaseous coolant is another example of the "integrated manufacture" approach, with the vacuum chamber serving as a temporary cryostat for in-situ measurements at low temperatures.

5. The mechanical integrity of the resulting coils will far exceed that of existing coils, because no windings can move, delaminate etc.

6. Winding with coated conductor results in "wasted" material not carrying substantial current—i.e. the substrate thickness is wasted in conventionally-wound coils. With the thin/thick film deposition process described above, the "substrate" is a cylinder which has considerably greater mechanical strength (compared with conventional nickel or nickel alloy substrates), so the deposition process is superior from both mechanical and electrical reasons, to the use of wound coated tape.

Although specific materials have been referred for use as the HTS films, any material—particularly magnesium diboride or ReBCO (of which YBCO is a common example, as Re denotes any rare earth element)— which, as a film, exhibits high temperature superconducting properties could be used for the manufacturing processes and articles described herein.

Similarly, any material which exhibits the physical properties of the buffer layers can be used in buffer layers acting, for example, as seed layers, insulators, or chemical barriers or combinations of these in the manufacturing processes and articles described herein. It is also common to have more than one buffer layer underneath the HTS film layer.

Specific process and approaches have been referred to above: such as RABiTS, in the context of ensuring a textured HTS layer whereby the necessary biaxial texture is imparted to a metallic substrate by a combination of rolling reductions and heat treatments; and in other cases IBAD, ISD and IAD, where the necessary biaxial seed layer is produced on a randomly-oriented substrate by depositing a buffer layer in such a way that it is textured. The references to those processes and apparatus also include variants of those specific processes. Such variants of those processes can include: texturing a cylinder by extrusion or melt texturing instead of rolling, or by molecular beam epitaxy (MBE), or hot dipping in a suitable flux. The texturing process may be driven by gradients in pressure, temperature or other physical parameters.

As described above, the present invention provides a method of fabricating a superconducting coil, the method comprising the step of fabricating individual coil windings by depositing and shaping electrically-conductive material in situ on a substantially cylindrical former.

Advantageously, the method further comprises the step of depositing and shaping buffer layers between successive coil windings.

Preferably, the electrically-conductive material is deposited on the former by a thin film deposition technique, and the buffer layers are deposited by a thin film deposition technique.

In a preferred embodiment, the method comprises an intial step of forming a spiral of textured buffer layer on the former and the textured buffer layer is formed by helically positioning a flexible textured tape onto the former.

In another preferred embodiment, the spiral textured buffer layer is formed by this thin deposition technique.

In a preferred embodiment, the thin film deposition technique includes the step of forming a spiral of textured buffer layer on the former, depositing an electrically-conductive layer over the spiral buffer layer to form a first coil winding, depositing a second buffer layer onto the electrically-conductive layer, and depositing a second electrically-conductive layer onto the second buffer layer, thereby forming a second winding of the coil, and repeating the buffer layer and electrically-conductive layer depositions to form as many coil windings as required, each deposition process being such as to transfer the texture of the underlying layer to the newly-deposited layer. In this case, the spiral of textured buffer layers may be written onto the former using the IBAD technique using a fixed ion beam and rotating and translating the former. Alternatively, the ion beam is translated and the former is rotated but not translated. Another possibility would be to form a buffer layer completely overlying a textured cylindrical former, and then removing a spiral track of the buffer layer (for example lithographically) to form the spiral of textured buffer layers.

Conveniently, each of the electrically-conductive layers is an YBCO layer. Alternatively, each of the electrically-conductive layers is any other suitable superconducting film such as a rare earth barium copper oxide (ReBCO) film.

Preferably, the method further comprises providing connecting links to connect the ends of adjacent coil windings. Conveniently, the connecting links are provided within the former, and each includes a fault current limiter.

Advantageously, the deposition steps take place in a film deposition chamber, and deposition of the buffer layers occurs from one side of the chamber, and deposition of the electrically-conductive layers occurs from the opposite side of the chamber, and the former is rotated during the deposition process. The two sides of the deposition chamber may be separated by baffles.

In another preferred embodiment, the former is provided with a textured cylindrical surface, and with a spirally-wound heater winding wire, the turns of which are spaced by the diameter of the wire, a first buffer layer is deposited to form a spiral buffer layer track between the turns of the heater winding, an electrically-conductive layer is deposited over the first buffer layer, and a further buffer layer is deposited on top of the electrically-conductive layer to form a first coil winding, a second heater winding wire is wound between the turns of the first heater winding wire, the first heater winding is removed, and a second coil winding is formed, the second coil winding being constituted by a first deposited buffer layer, a deposited electrically-conductive layer and a second deposited buffer layer, and the process is repeated to form additional coil windings as required, each deposition process being such as to transfer the texture of the underlying layer to the newly-deposited layer.

The method may further comprise the step of circulating coolant within the former, and/or of testing, in situ, each coil winding.

The invention also provides a method of making a multi-layered textured superconducting coil, the method including the steps of fabricating superconductor coil windings and insulating layers by film deposition means, whereby the films are patterned by masking or machining operations before or after film deposition, in-situ or ex-situ, and/or by subsequently patterning using lithographic techniques allowing a tailoring of coil properties by changing the geometry (width, thickness) of the superconducting paths at every point on the surface.

The invention further provides a method of fabricating a superconducting coil, the method comprising the step of helically positioning a flexible coated tape onto a substantially cylindrical former, the coated tape being constituted by an insulating buffer layer and a coating of electrically-conductive material.

Advantageously, YBCO constitutes the electrically-conductive material, and the tape is a textured substrate made, for example, by the RABiTS process.

Preferably, the former is generally barrel-shaped, with tapered portions at each end of a cylindrical control main portion.

The invention claimed is:

1. A method of fabricating a superconducting coil, by fabricating individual coil windings by depositing, shaping and texturing superconductive material and buffer material on a former which has a substantially curved surface, the method comprising the steps of:
    forming a textured buffer layer on the former;
    depositing a first layer of superconductive material over the textured buffer layer so as to copy the crystallographic texture of the textured buffer layer to the first layer of superconductive material;
    depositing a second buffer layer over the first layer of superconductive material so as to copy the crystallographic texture of the first layer of superconductive material to the second buffer layer;
    depositing a second layer of superconductive material over the second buffer layer so as to copy the crystallographic texture of the second buffer layer to the second layer of superconductive material;
    depositing further buffer layers and layers of superconductive material alternately so as to copy the crystallographic texture of each underlying layer to each overlying layer, the depositing, shaping and texturing forming successive coil windings in the layers of the superconductive material;
    forming a reinforcement shell on the coil after depositing the layers of superconductive material;
    forming a textured layer on the surface of the reinforcement shell to define a further buffer layer using the same process as used on the textured buffer layer;
    forming further coil windings by the addition of sequential superconducting and buffer layers; and
    providing connecting links to connect the ends of adjacent coil windings.

2. A method as claimed in claim 1, wherein the former defines a substantially cylindrical surface.

3. A method as claimed in claim 2, wherein the former defines a substantially right circular cylindrical surface.

4. A method as claimed in claim 1, wherein each layer of superconductive material is deposited by a film deposition technique.

5. A method as claimed in claim 1, wherein each of the textured buffer layers is deposited by a film deposition technique.

6. A method as claimed in claim 5, further comprising an initial step of forming a spiral of textured buffer layers on the former.

7. A method as claimed in claim 5, further including the steps of fabricating superconductor coil windings and insulating layers by film deposition means, whereby each film is patterned by masking or machining operations before or after film deposition by the film deposition means.

8. A method as claimed in claim 5, further including the steps of fabricating superconductor coil windings and insulating layers by film deposition means, whereby the films are patterned in-situ.

9. A method as claimed in claim 5, further including the steps of fabricating superconductor coil windings and insulating layers by film deposition means, whereby the films are patterned using lithographic techniques allowing a tailoring of coil properties by controlling the geometry of the superconducting paths at every point on the surface.

10. A method as claimed in claim 1, wherein the textured buffer layer is formed by helically positioning a flexible textured tape onto the former.

11. A method as claimed in claim 1, wherein the textured buffer layer is formed by a film deposition technique.

12. A method as claimed in claim 1, wherein the textured buffer layer is written onto the former using the IBAD technique using a fixed ion beam and rotating and translating the former.

13. A method as claimed in claim 12, further including the steps of fabricating superconductor coil windings and insulating layers by film deposition means, whereby each film is patterned by masking or machining operations before or after film deposition by the film deposition means.

14. A method as claimed in claim 12, further including the steps of fabricating superconductor coil windings and insulating layers by film deposition means, whereby the films are patterned in-situ.

15. A method as claimed in claim 12, further including the steps of fabricating superconductor coil windings and insulating layers by film deposition means, whereby the films are subsequently patterned using lithographic techniques allowing a tailoring of coil properties by controlling the geometry of the superconducting paths at every point on the surface.

16. A method as claimed in claim 1, wherein each of the layers of superconductive material is a YBCO layer.

17. A method as claimed in claim 1, wherein the connecting links are provided within the former.

18. A method as claimed in claim 1, wherein each of the connecting links includes a fault current limiter.

19. A method as claimed in claim 1, wherein all the depositing steps take place in a film deposition chamber.

20. A method as claimed in claim 19, wherein the former is provided with a spirally-wound heater winding wire, the turns of which are spaced by a means for spacing, said textured layer is deposited to form a spiral track between the turns of the heater winding, the first layer of superconductive material is deposited over the textured layer, and the first buffer layer is deposited on top of the first layer of superconductive material to form a first coil winding, a second heater winding wire is wound between the turns of the first heater winding wire, the first heater winding is removed, the second layer of superconductive material is deposited on top of the first buffer layer to form a second coil winding, and the process of providing winding heater wires and depositing buffer layers and layers of superconductive material is repeated to form additional coil windings as required, each deposition process transferring the crystallographic texture of the underlying layer to a newly-deposited layer.

21. A method as claimed in claim 20, wherein the means for spacing the turns of the spirally-wound heater winding wire is the diameter of the wire.

22. A method as claimed in claim 20, wherein the means for spacing the turns of the spirally-wound heater winding wire is by grooves in the former.

23. A method as claimed in claim 20, further comprising the step of circulating coolant within the former.

24. A method as claimed in claim 20, further comprising the step of testing, in situ, each coil winding in terms of texture or superconducting performance.

25. A method as claimed in claim 1, wherein the fabrication of a multilayered textured superconducting coil includes the steps of fabricating superconductor coil windings and insulating layers by film deposition means, whereby each film is patterned by masking or machining operations before or after film deposition by the film deposition means.

26. A method as claimed in claim 1, wherein the fabrication of a multilayered textured superconducting coil includes the steps of fabricating superconductor coil windings and insulating layers by film deposition means, whereby the films are patterned in-situ.

27. A method as claimed in claim 1, wherein the fabrication of a multilayered textured superconducting coil includes the steps of fabricating superconductor coil windings and insulating layers by film deposition means, whereby the films are patterned using lithographic techniques allowing a tailoring of coil properties by controlling the geometry of the superconducting paths at every point on the surface.

28. A method of fabricating a superconducting coil, by fabricating individual coil windings by depositing, shaping and texturing superconductive material and buffer material on a former which has a substantially curved surface, the method comprising the steps of:

forming a textured buffer layer on the former;

depositing a first layer of superconductive material over the textured buffer layer so as to copy the crystallographic texture of the textured buffer layer to the first layer of superconductive material;

depositing a second buffer layer over the first layer of superconductive material so as to copy the crystallographic texture of the first layer of superconductive material to the second buffer layer;

depositing a second layer of superconductive material over the second buffer layer so as to copy the crystallographic texture of the second buffer layer to the second layer of superconductive material;

depositing further buffer layers and layers of superconductive material alternately so as to copy the crystallographic texture of each underlying layer to each overlying layer, the depositing, shaping and texturing forming successive coil windings in the layers of the superconductive material;

forming a reinforcement shell on the coil after depositing the layers of superconductive material;

forming a textured layer on the surface of the reinforcement shell to define a further buffer layer using the same process as used on the textured buffer layer; and forming further coil windings by the addition of sequential superconducting and buffer layers, wherein all the depositing steps take place in a film deposition chamber, and wherein the depositing of the buffer layers occurs from one side of the deposition chamber, and the depositing of the layers of superconductive material occurs from the opposite side of the deposition chamber, and the former is rotated during each deposition step.

29. A method as claimed in claim 28, wherein the two sides of the deposition chamber are separated by baffles.

30. A method of fabricating a superconducting coil, by fabricating individual coil windings by depositing, shaping and texturing superconductive material and buffer material on a former which has a substantially curved surface, the method comprising the steps of:

forming a textured buffer layer on the former;

depositing a first layer of superconductive material over the textured buffer layer so as to copy the crystallographic texture of the textured buffer layer to the first layer of superconductive material;

depositing a second buffer layer over the first layer of superconductive material so as to copy the crystallographic texture of the first layer of superconductive material to the second buffer layer;

depositing a second layer of superconductive material over the second buffer layer so as to copy the crystallographic texture of the second buffer layer to the second layer of superconductive material;

depositing further buffer layers and layers of superconductive material alternately so as to copy the crystallographic texture of each underlying layer to each overlying layer, the depositing, shaping and texturing forming successive coil windings in the layers of the superconductive material;

forming a reinforcement shell on the coil after depositing the layers of superconductive material;

forming a textured layer on the surface of the reinforcement shell to define a further buffer layer using the same process as used on the textured buffer layer;

forming further coil windings by the addition of sequential superconducting and buffer layers; and providing connecting links between the layers of the superconductive material.

\* \* \* \* \*